United States Patent
Kondo

(10) Patent No.: US 12,395,131 B2
(45) Date of Patent: Aug. 19, 2025

(54) AMPLIFIER CIRCUIT AND SONAR

(71) Applicant: Furuno Electric Co., Ltd., Nishinomiya (JP)

(72) Inventor: Futoshi Kondo, Nishinomiya (JP)

(73) Assignee: FURUNO ELECTRIC CO., LTD., Nishinomiya (JP)

( * ) Notice: Subject to any disclaimer, the term of this patent is extended or adjusted under 35 U.S.C. 154(b) by 263 days.

(21) Appl. No.: 18/097,503

(22) Filed: Jan. 17, 2023

(65) Prior Publication Data

US 2023/0238924 A1 Jul. 27, 2023

(30) Foreign Application Priority Data

Jan. 25, 2022 (EP) .................................... 22153209
Sep. 20, 2022 (EP) .................................... 22196686
Nov. 15, 2022 (EP) .................................... 22207472

(51) Int. Cl.
*G01S 7/524* (2006.01)
*G01S 7/52* (2006.01)
*H03F 1/56* (2006.01)

(52) U.S. Cl.
CPC ............... *H03F 1/565* (2013.01); *G01S 7/52* (2013.01); *G01S 7/524* (2013.01); *H03F 2200/387* (2013.01)

(58) Field of Classification Search
CPC . G01S 7/52; G01S 7/521; G01S 15/96; G01S 7/524; G10K 11/02; G10K 2200/11; H03F 1/565; H03F 2200/387; B06B 1/0269; B06B 2201/74; B06B 2201/55; H01L 2224/48227; H01L 2224/48091; H01L 2224/48225
See application file for complete search history.

(56) References Cited

U.S. PATENT DOCUMENTS 5,636,147 A * 6/1997 Tolmie .................. B06B 1/0207
                                                                 703/5
5,757,104 A    5/1998 Getman et al.
7,879,185 B2 * 2/2011 Shannon ........... H01J 37/32183
                                                                 156/345.44

(Continued)

FOREIGN PATENT DOCUMENTS

DE    69416129 T2 *  7/1997
EP     2743725 A1    6/2014
JP    2008-60879 A   3/2008

OTHER PUBLICATIONS

European Search Opinion received for EP Application 22153209.6, 11 pages.

(Continued)

*Primary Examiner* — Daniel L Murphy
*Assistant Examiner* — Amie M Ndure
(74) *Attorney, Agent, or Firm* — XSENSUS LLP

(57) ABSTRACT

An amplifier circuit to be used in a sonar is described. The amplifier circuit includes a transducer and a matching circuit. The transducer has an impedance characteristic having a resonance frequency and an anti-resonance frequency higher than the resonance frequency. The matching circuit is connected to the transducer. The impedance characteristic of the transducer connected to the matching circuit has a first resonance frequency and a second resonance frequency higher than the first resonance frequency.

18 Claims, 12 Drawing Sheets

(56) References Cited

U.S. PATENT DOCUMENTS

| | | | |
|---|---|---|---|
| 9,103,905 B2* | 8/2015 | Lee | G01S 15/02 |
| 9,308,554 B2* | 4/2016 | Campbell | B06B 1/0614 |
| 9,698,749 B2* | 7/2017 | Yang | H03H 7/40 |
| 2005/0133163 A1* | 6/2005 | Shannon | H01J 37/32082 |
| | | | 156/345.44 |
| 2012/0163126 A1* | 6/2012 | Campbell | B06B 1/0614 |
| | | | 367/137 |
| 2014/0160892 A1* | 6/2014 | Lee | G01S 7/524 |
| | | | 367/87 |

OTHER PUBLICATIONS

Extended European search report issued on May 31, 2023, in corresponding European patent Application No. 22207472.6, 17 pages.

Communication pursuant to Rule 69 EPC issued on Jul. 31, 2023, in corresponding European patent Application No. 22207472.6, 2 pages.

* cited by examiner

AMPLIFIER CIRCUIT AND SONAR

CROSS-REFERENCE TO RELATED APPLICATION(S)

This application claims priority under 35 U.S.C. § 119 to European Patent Application No. EP22207472.6 filed Nov. 15, 2022, European Patent Application No. EP22196686.4 filed Sep. 20, 2022, and European Patent Application No. EP22153209.6 filed Jan. 25, 2022, which are hereby incorporated by reference in their entirety.

TECHNICAL FIELD

The present disclosure relates to an amplifier circuit for amplifying a voltage applied to a transducer and a sonar having the amplifier circuit.

BACKGROUND

A SONAR (sound navigation and ranging) is a technique that utilizes sound propagation to navigate, measure distances, and communicate with or detect objects on or under the surface of the water, such as other vessels. The sonar contains a transmitter for transmitting ultrasonic waves underwater. Further, the transmitter drives a transducer based on a transmission signal to transmit the ultrasonic waves underwater. Since an impedance of the transducer is high, it is necessary to apply the transmission signal with a high voltage to the transducer at the time of transmission. Conventionally, a transformer has been used as a means for amplifying voltage. However, since a transformer is large in size, the sonar device becomes large.

Currently, a method has been implemented for amplifying a voltage without using a transformer, instead, uses a matching circuit. In this method, the impedance at a resonance frequency can be lowered by matching the resonance frequency of the transducer connected to the matching circuit with the resonance frequency of the transducer itself. Thus, the voltage can be effectively amplified in a vicinity of the resonance frequency, and a high voltage can be applied to the transducer.

However, in the above configuration, since there is only one resonance frequency of the impedance, a band in which the transmission power of the transducer is stable is limited to a narrow band near the resonance frequency. On the other hand, the sonar should be able to transmit ultrasonic waves in as wide the band as possible. For example, when there is another ship in the vicinity of the own ship, it is preferable that the ultrasonic wave can be transmitted at a frequency different from a transmission frequency of the sonar installed in the other ship, in order to avoid interference. When the sonar transmits a wave based on a chirp signal, it is necessary to shift the transmission frequency of the ultrasonic wave by a shift amount.

However, in the above configuration, since the band in which the transmission power of the transducer is stable, is narrow, it is difficult to respond to these requests. Therefore, there is a need for an improved apparatus and method for the amplifier circuit to be used in the sonar.

An objective of the present disclosure is to provide an amplifier circuit capable of effectively expanding a band in which transmission power of a transducer is stable, and a sonar provided with the amplifier circuit.

SUMMARY

In accordance with an example embodiment, a first aspect of the present disclosure relates to the amplifier circuit to be used in the sonar. The amplifier circuit of the present aspect includes a transducer and a matching circuit. The transducer has an impedance characteristic having a resonance frequency and an anti-resonance frequency higher than the resonance frequency. The matching circuit is connected to the transducer. Further, the impedance characteristic of the transducer connected to the matching circuit includes a first resonance frequency and a second resonance frequency higher than the first resonance frequency.

Further, since the impedance characteristic of the transducer connected to the matching circuit includes the first resonance frequency and the second resonance frequency, the transmission power of the transducer can be stabilized in the vicinity of the band over these resonance frequencies. Thus, the band in which the transmission power of the transducer can be stabilized, can be effectively expanded.

In the amplifier circuit, according to the present aspect, the matching circuit may include a capacitive component and an inductor. The capacitive component may be connected in parallel with the transducer, and the inductor may be connected in series with the parallel connection. A capacitance of the capacitive component and an inductance of the inductor may be selected such that the impedance characteristic of the transducer connected to the matching circuit has the first resonance frequency and the second resonance frequency. The impedance characteristic of the transducer connected to the matching circuit may have a first anti-resonance frequency between the first resonance frequency and the second resonance frequency. The first anti-resonance frequency may be defined based at least in part on the capacitance of the capacitive component. The capacitance of the capacitive component and the inductance of the inductor may be selected based on equation $$\omega^2 L_1 \frac{(c_0 + c_L)c_1}{c_0 + c_L + c_1} = 1,$$

where $C_L$ is a value of the capacitance of the capacitive component in the matching circuit, $L_1$, $C_0$ and $C_1$ are values of an inductor L1 and capacitors C0 and C1 in an equivalent circuit representing the transducer, and $\omega$ is the first anti-resonance frequency, with a margin of +/−20% in values of the capacitance of the capacitive component and the inductance of the inductor.

The effect or significance of the present disclosure will be further clarified by the following description of the embodiments. However, the embodiments shown below are only examples for implementing the present disclosure, and the present disclosure is not limited in any way to the embodiments described below.

BRIEF DESCRIPTION OF THE DRAWINGS

FIG. 11(*b*) is a diagram illustrating an equivalent circuit of the transducer with a plurality of matching layers stacked and fixed to the transducer, according to a modification of the another embodiment of the present disclosure.

DETAILED DESCRIPTION

Some embodiments of this disclosure, illustrating its features, will now be discussed in detail. The words "comprising," "having," "containing," and "including," and other forms thereof, are intended to be equivalent in meaning and be open ended in that an item or items following any one of these words is not meant to be an exhaustive listing of such item or items, or meant to be limited to the listed item or items.

It should also be noted that as used herein and in the appended claims, the singular forms "a," "an," and "the" include plural references unless the context clearly dictates otherwise. Although any apparatus and method similar or equivalent to those described herein can be used in the practice or testing of embodiments of the present disclosure, the apparatus and methods are now described.

Embodiments of the present disclosure will be described more fully hereinafter with reference to the accompanying drawings in which like numerals represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples.

Embodiments of the present disclosure will be described below with reference to the drawings. For convenience, XYZ axes orthogonal to each other are appropriately appended to the drawings. An X-axis direction and a Y-axis direction are horizontal, and a Z-axis direction is vertical. The positive Y-axis direction is the direction in which a ship travels.

Figure 1:
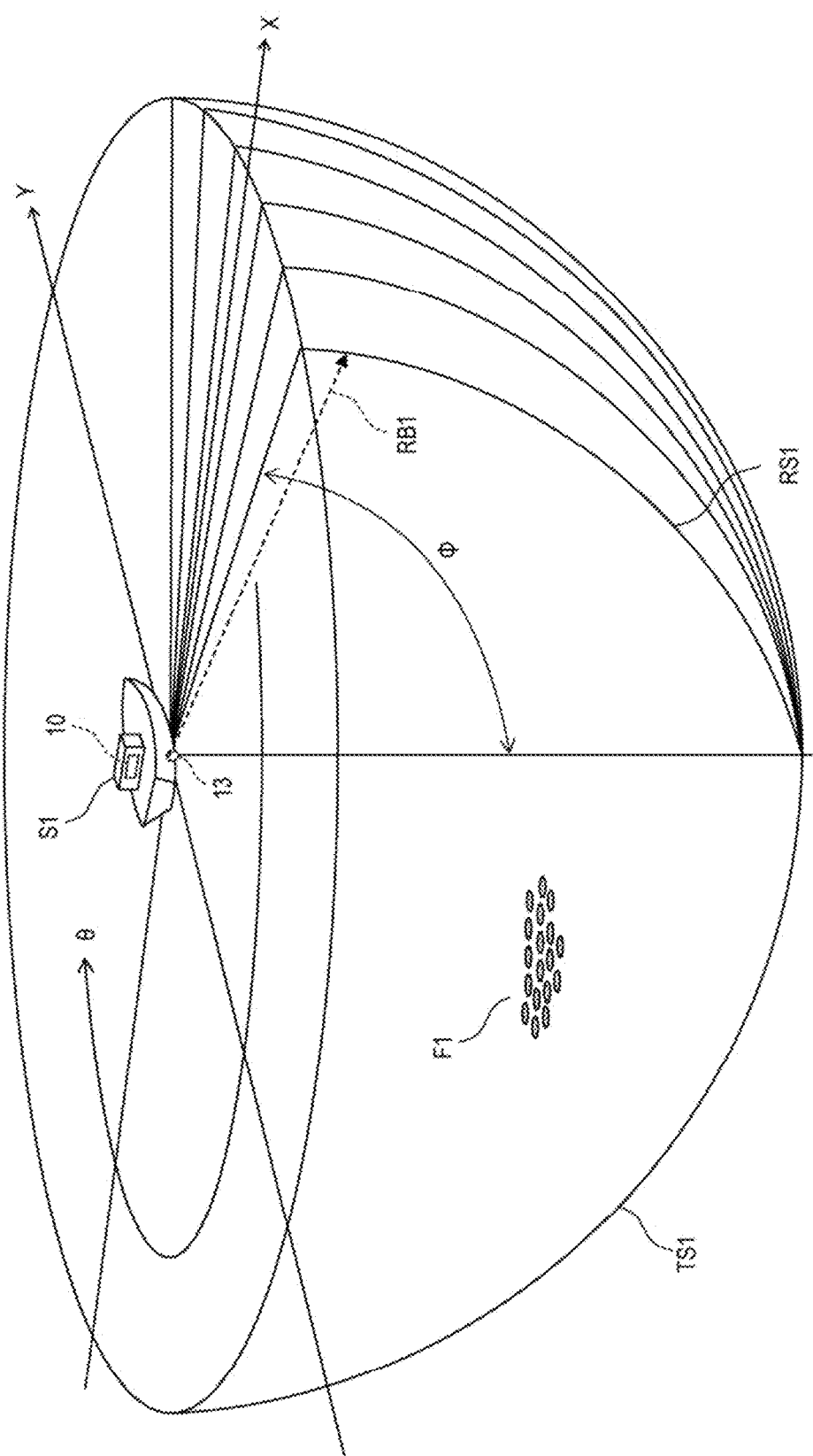
FIG. 1 is a diagram schematically illustrating a state in which a sonar searches underwater, according to an embodiment of the present disclosure.

FIG. 1 is a diagram schematically illustrating a state in which a sonar 10 searches underwater, according to an embodiment of the present disclosure. In FIG. 1, θ is an azimuth angle around a transducer assembly 13 installed on a bottom of a ship S1, and φ is a depression angle from a horizontal plane (X-Y plane). In one embodiment, the sonar 10 may include the transducer assembly 13 installed on the bottom of the ship S1. Further, ultrasonic waves may be transmitted from the transducer assembly 13 to a semi-spherical transmission space TS1 and resulting reflected waves may be received by the transducer assembly 13. Further, the transducer assembly 13 may include a plurality of transducers for transmitting and receiving ultrasonic waves. The transducers may be arranged, for example, in a hemispherical or cylindrical shape. A reception signal corresponding to an intensity (echo intensity) of the reflected wave received by each transducer is generated for each transducer. It can be noted that the sonar 10 may form a plurality of reception beams RB1 distributed in the azimuth angle θ direction and the depression angle φ direction by beamforming the reception signals.

In one embodiment, the sonar 10 may generate the plurality of reception beams RB1 in fan-shaped reception spaces RS1 extending in the depression angle φ direction. Further, the plurality of reception beams RB1 may be formed in each reception space RS1 with a predetermined resolution in the depression angle φ direction. The reception spaces RS1 may be set at a predetermined pitch over the entire circumference in the azimuth angle θ direction. Further, an actual pitch of the reception spaces RS1 may be smaller than the pitch illustrated in FIG. 1. It can be noted that a spread angle of the reception spaces RS1 in the depression angle φ direction is, for example, 90 degrees.

In one embodiment, the sonar 10 may acquire the echo intensity with a given distance resolution for each reception beam RB1 formed in the reception spaces RS1. Thus, the echo intensity is acquired at the given distance resolution for each depression angle of each reception beam RB1. The sonar 10 may integrate the echo intensity of each depression angle and each distance acquired for each reception space RS1 with respect to all the reception spaces RS1. It can be noted that, such use of the sonar 10 may facilitate acquiring an echo signal in which the echo intensity is three-dimensionally distributed in the transmission space TS1.

The sonar 10 may display an echo image showing a three-dimensional distribution of echo intensity on a display module by using the acquired echo signal. Each three-dimensional position on the echo image is coloured according to the echo intensity. For example, a position of a fish school F1 on the echo image is assigned a colour (for example, red) associated with a high echo intensity. Further, a user can grasp targets such as the fish school F1 by referring to the colour distribution on the echo image.

Figure 2:
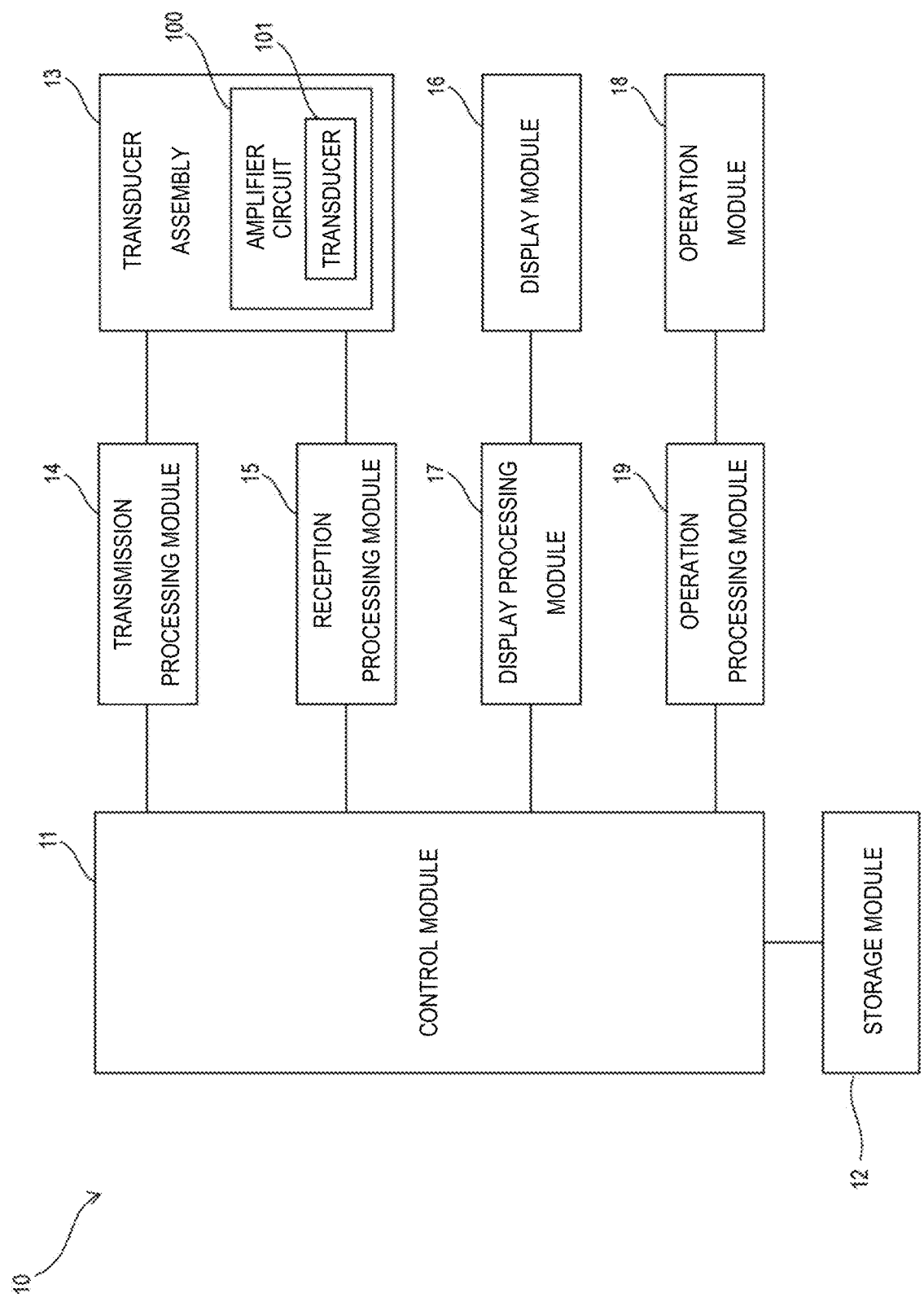
FIG. 2 is a block diagram illustrating a configuration of the sonar, according to an embodiment of the present disclosure.

FIG. 2 is a block diagram illustrating a configuration of the sonar 10, according to a present embodiment of the present disclosure. In one embodiment, the sonar 10 may include a control module 11, a storage module 12, the transducer assembly 13, a transmission processing module 14, a reception processing module 15, a display module 16, a display processing module 17, an operation module 18, and an operation processing module 19. The transducer assembly 13 may be installed in the bottom of the ship S1 as described above, and other components such as the control module 11 may be installed in a wheelhouse of the ship S1.

Further, the control module 11 may be provided with an arithmetic processing circuit such as a CPU (Central Processing Unit) that executes control processing according to a program stored in the storage module 12. The storage module 12 may include a storage medium such as a ROM (Read Only Memory), a RAM (Random Access Memory), and a hard disk. The storage module 12 stores the program for the control module 11 to execute the control processing.

In one embodiment, the transducer assembly 13 may include one or more transducers 101. Further, the one or more transducers 101 may be arranged in a hemispherical or cylindrical shape. Each transducer 101 may transmit ultrasonic waves to the transmission space TS1 in FIG. 1 for each processing step (ping) of transmitting and receiving waves and receive the reflected waves. The transducer assembly 13 may include an amplifier circuit 100 as a configuration for transmitting waves. The amplifier circuit 100 may amplify a voltage of a transmission signal and supply it to the transducer 101.

In accordance with the control from the control module 11, the transmission processing module 14 outputs the transmission signal to the transducer assembly 13 for transmitting ultrasonic waves. The reception processing module 15 may generate the reception signal by processing a signal outputted by each transducer of the transducer assembly 13 that receives the reflected wave, and outputs the generated reception signal to the control module 11.

Further, the control module 11 may form the plurality of reception beams distributed in the azimuth angle $\theta$ direction and the depression angle $\varphi$ direction by beamforming the reception signals acquired from the respective transducers. The control module 11 may acquire echo signals in the directions of the respective reception beams (the directions of the given azimuth angles $\theta$ and depression angles $\varphi$). The echo signal acquired for each reception beam is the signal indicating the echo intensity that changes according to the elapsed time from a transmission timing of the ultrasonic wave.

In one embodiment, the elapsed time from the transmission timing may correspond to a distance from the transducer assembly 13 in the direction of each reception beam. Further, the control module 11 may acquire the echo intensity of each distance position in the direction of each reception beam from the echo signal of each reception beam by associating the elapsed time from the transmission timing with the distance. The echo intensity may be acquired with a given distance resolution.

In one embodiment, the display module 16 includes a display device such as a liquid crystal display. The display processing module 17 may cause the display module 16 to display the echo image in response to the control from the control module 11. The operation module 18 may be provided with an input means such as an operation key or a mouse. The operation processing module 19 may output a signal corresponding to an operation on the operation module 18 to the control module 11. The user may, for example, change a viewpoint of the echo image by operating the operation module 18. Further, the display module 16 and the operation module 18 may be constituted by a liquid crystal panel in which a touch panel is superimposed on the liquid crystal display.

Figure 3:
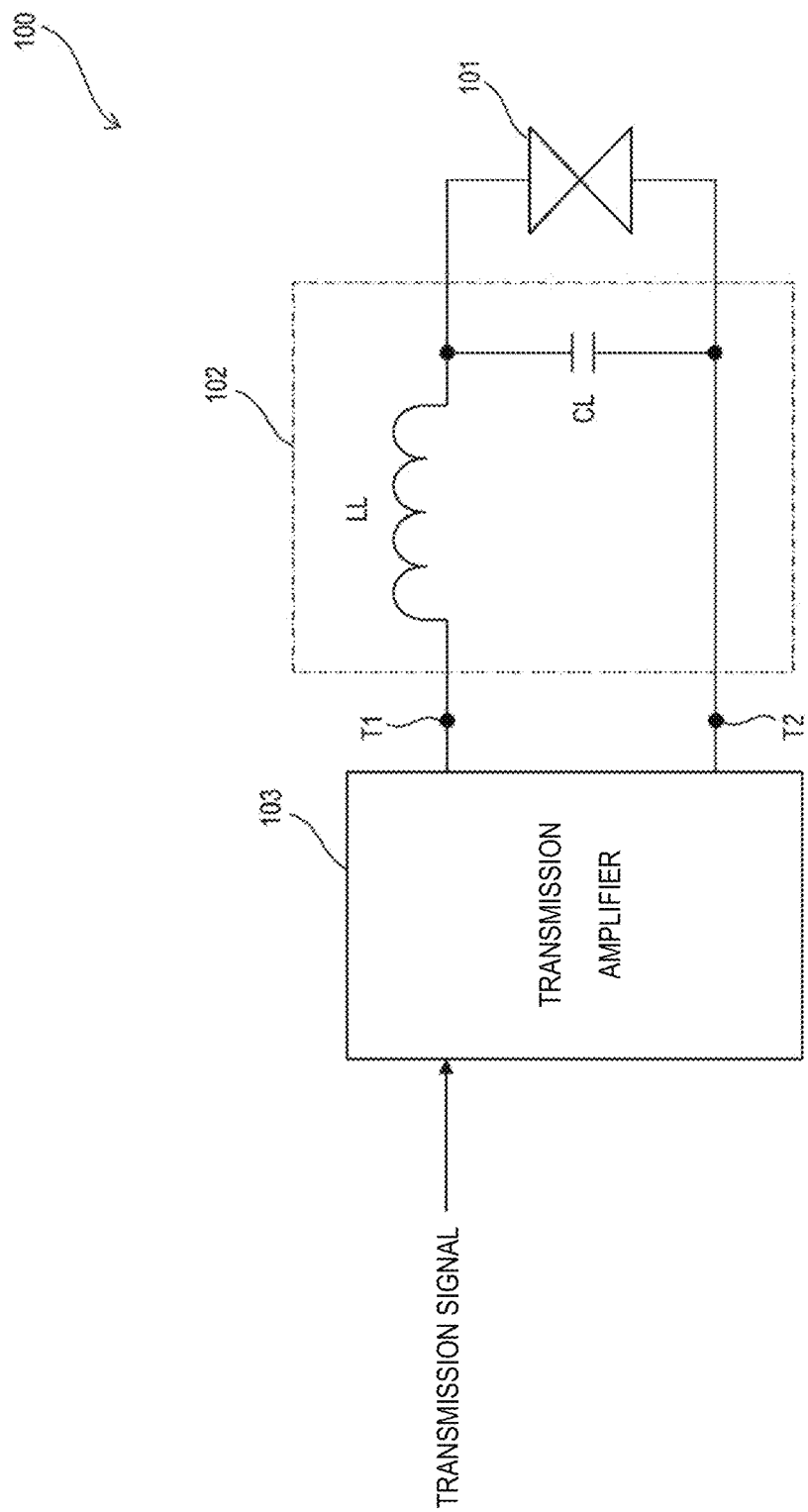
FIG. 3 is a diagram illustrating a configuration of an amplifier circuit, according to an embodiment of the present disclosure.

FIG. 3 is a diagram illustrating a configuration of the amplifier circuit 100 in FIG. 2, according to an embodiment of the present disclosure. In one embodiment, FIG. 3 illustrates a configuration for driving one transducer 101. The same configuration in FIG. 3 may be provided for each of the one or more transducers 101. The amplifier circuit 100 may include the transducer 101, a matching circuit 102, and a transmission amplifier 103.

In one embodiment, the transducer 101 may include a piezoelectric element. Further, the transducer 101 may output ultrasonic waves when the voltage corresponding to the transmission signal is applied thereto. Further, the matching circuit 102 may include a capacitive component CL and an inductor LL. The capacitive component CL may be connected in parallel with the transducer 101. Further, the inductor LL may be connected in series to the parallel connection of the capacitive component CL and the transducer 101. The capacitive component CL may be a capacitor or other component (for example, cables, etc.) as long as it has the capacitance of a given value. The transmission amplifier 103 may amplify positively and negatively the voltage at a frequency corresponding to the transmission signal and output it at terminal T1. Terminal T2 is connected to the ground.

Figure 4B:
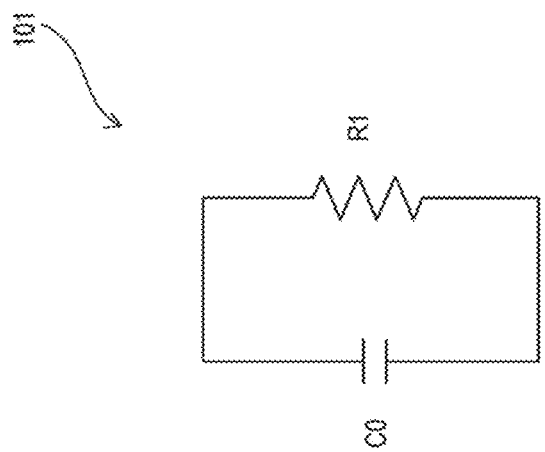
FIG. 4(a) is a diagram illustrating an equivalent circuit of a transducer, according to an embodiment of the present disclosure.
FIG. 4(*b*) is a diagram illustrating the equivalent circuit of the transducer at resonance frequency, according to an embodiment of the present disclosure.

FIG. 4(*a*) is a diagram illustrating an equivalent circuit of the transducer 101, according to an embodiment of the present disclosure. The equivalent circuit of the transducer 101 may be represented by a circuit in which a capacitor C1, an inductor L1, and a resistor R1 are connected in series, and a capacitor C0 is connected in parallel to the series connection. In the configuration illustrated in FIG. 3, for example, by matching a resonance frequency of the transducer 101 connected to the matching circuit 102 with the resonance frequency of the equivalent circuit of the transducer 101 illustrated in FIG. 4(*a*), an impedance at the resonance frequency can be effectively reduced. Thus, the voltage supplied to the transducer 101 can be increased, and transmission power can be effectively increased. It can be noted that, the configuration may be referred to as a "comparative example", hereinafter.

Figure 4A:
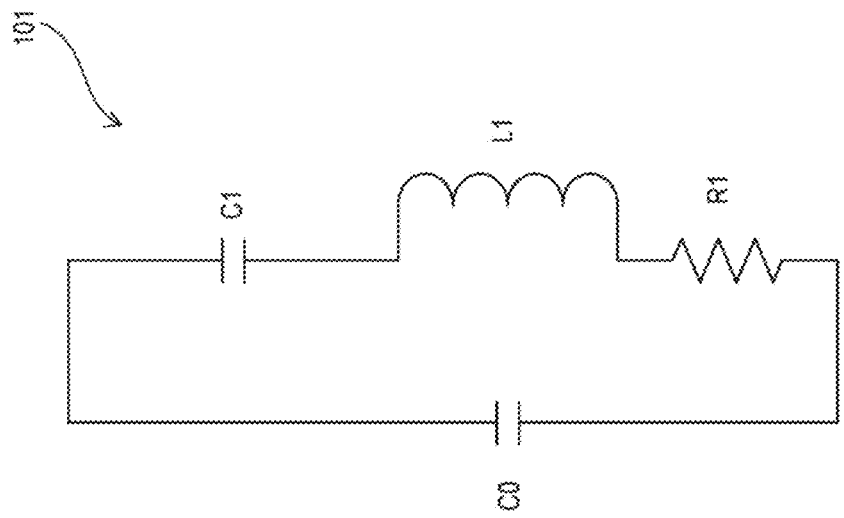
Figure 5:
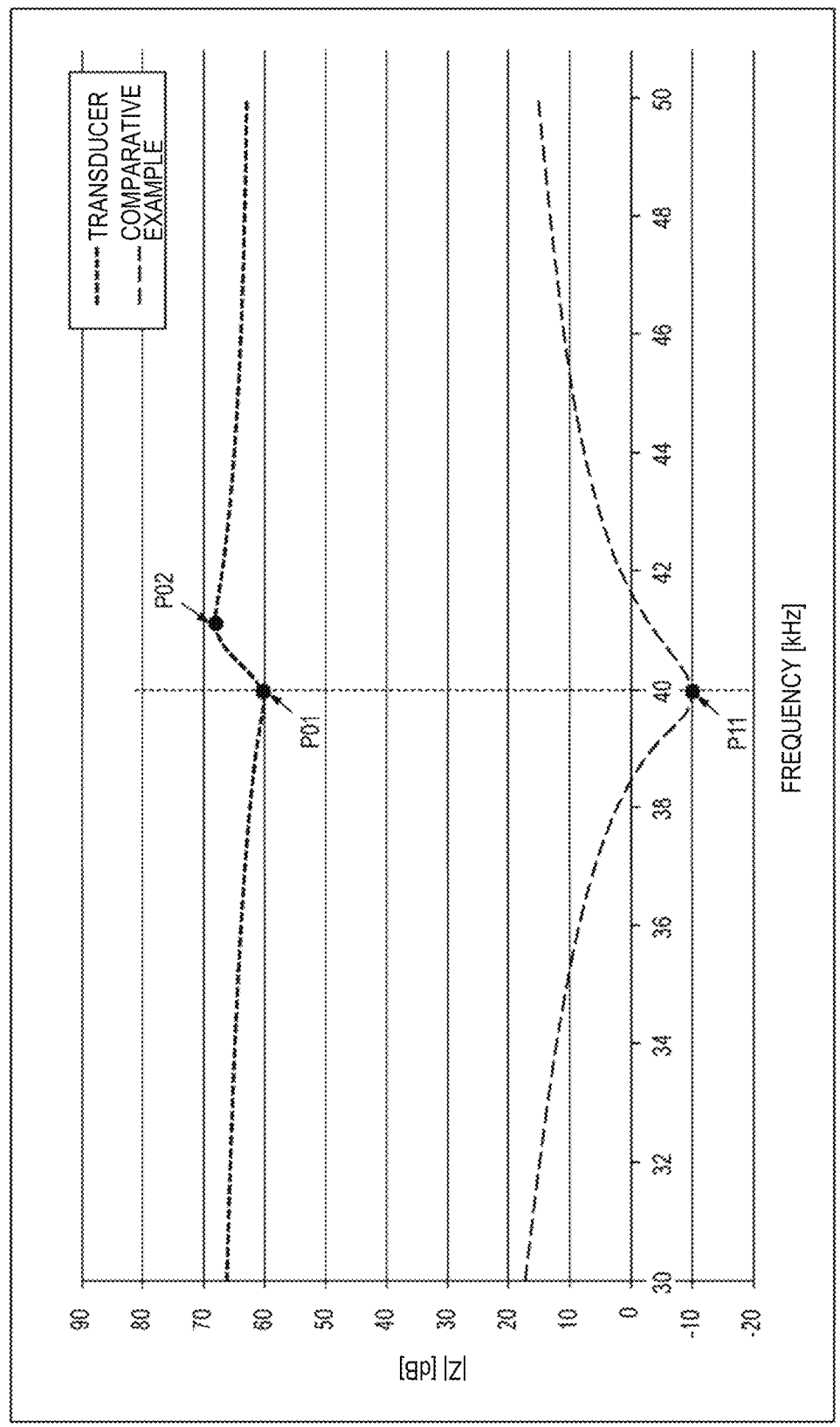
FIG. 5 is a graph illustrating impedance characteristics at transmission according to a comparative example.

FIG. 5 is a graph illustrating impedance characteristics at transmission according to the comparative example. The upper graph of FIG. 5 illustrates an example of impedance characteristic of the equivalent circuit of the transducer 101 of FIG. 4(*a*). The lower graph of FIG. 5 illustrates an example of impedance characteristic of the transducer 101 connected to the matching circuit 102.

Further, as illustrated in the upper graph of FIG. 5, the impedance characteristic of the equivalent circuit of the transducer 101 has a resonance point P01 and an anti-resonance point P02. A resonance point is a local minimum in the impedance characteristic, whereas an anti-resonance point is a local maximum in the impedance characteristic. As there is a local minimum in the impedance at the resonance point, the transducer has a good ability of transmitting high power ultrasonic wave into water. On the other hand, at the anti-resonance point, as there is a local maximum in the impedance, the transducer has a low ability of transmitting ultrasonic wave. For example, with the same voltage applied to the transducer at the resonance point and at the anti-resonance point, ultrasonic waves with less power would be transmitted into the water at the anti-resonance point than at the resonance point. Moreover, the anti-resonance point is a characteristic of the transducer that indicates the frequency at which the transducer is optimum to receive ultrasonic wave at the best sensitivity. The frequency at the resonance point P01, that is, the resonance frequency is the frequency when the value obtained by multiplying a capacitance of the capacitor C1 and an inductance of the inductor L1 in the equivalent circuit of FIG. 4(*a*) is 1. Therefore, the equivalent circuit of the transducer 101 at the resonance point is represented by the circuit of FIG. 4(*b*).

In the comparative example, as illustrated in the lower part of FIG. 5, values of the inductor LL and the capacitive component CL of the matching circuit 102 may be adjusted so that the resonance frequency (resonance point P11) of the transducer 101 connected to the matching circuit 102 matches the resonance frequency (resonance point P01) of the equivalent circuit of the transducer 101. In one example embodiment, the value (i.e., capacitance) $C_L$ of component CL is set to about 100 times or more of value $C_0$ of the capacitor C0 in FIG. 4(a), and value (i.e., inductance) $L_L$ of the inductor LL is set to satisfy $\omega^2 \times L_L \times C_L = 1$ at the resonance frequency so that a circuit characteristic of the matching circuit 102 does not collapse due to interference with the transducer 101.

It can be noted that, as shown in the lower part of FIG. 5, the impedance of the transducer 101 connected to the matching circuit 102 at the resonance point P11 may be effectively lowered from the impedance of the transducer 101 in the upper part of FIG. 5. Therefore, by setting the frequency of the transmission signal near the resonance point P11, the transmission power of the transducer 101 may be effectively increased.

Further, in the configuration of the comparative example, since only one resonance point P11 exists in the impedance characteristic of the transducer 101 connected to the matching circuit 102, the band in which the transmission power of the transducer 101 is stable becomes considerably narrow as described later. Therefore, in the present embodiment, the values of the inductor LL and the capacitive component CL of the matching circuit 102 may be adjusted so that the impedance characteristic of the transducer 101 connected to the matching circuit 102 has two resonance points (resonance frequencies).

Figure 6:
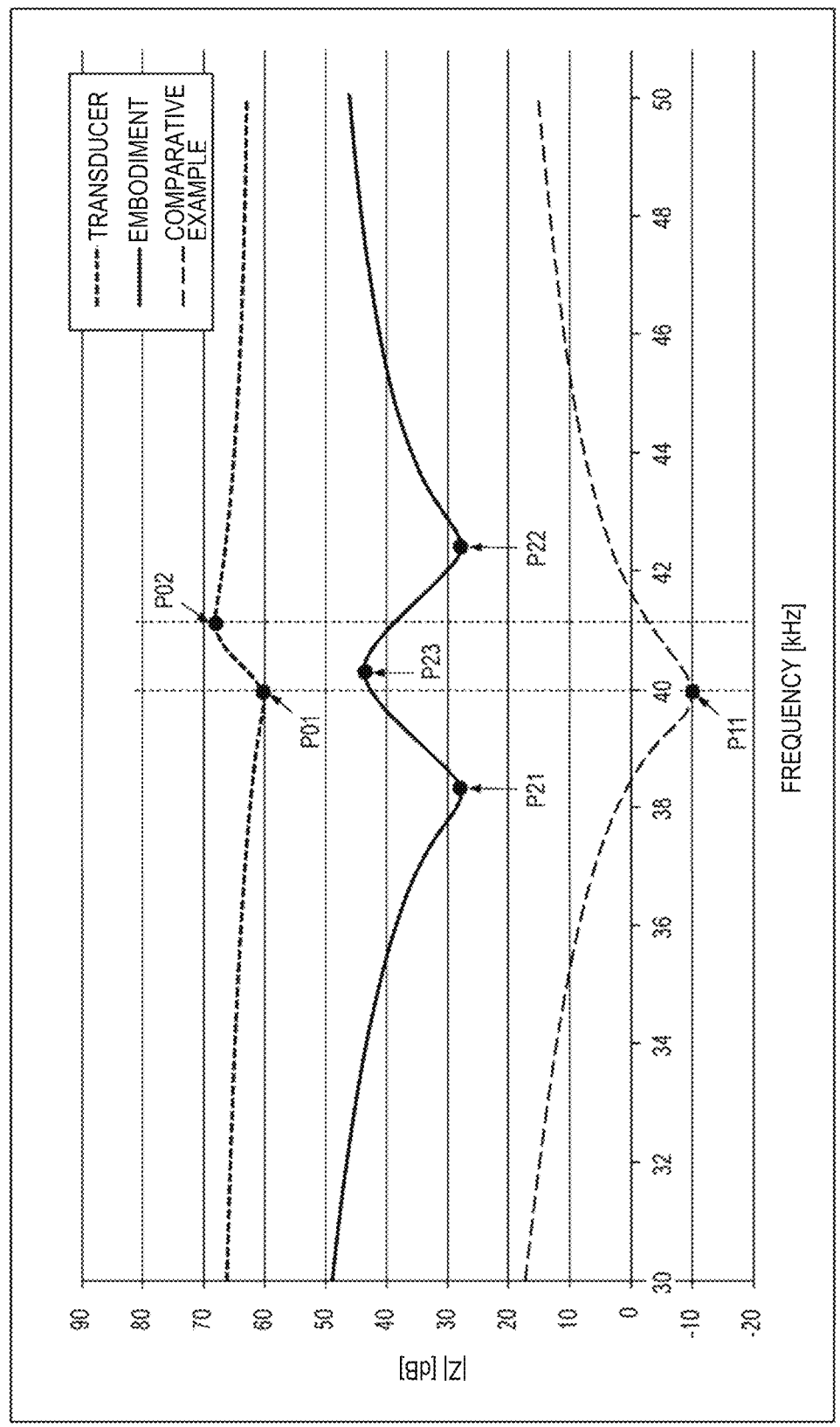
FIG. 6 is a graph illustrating impedance characteristics at transmission, according to an embodiment of the present disclosure.

FIG. 6 is a graph illustrating the impedance characteristics at transmission, according to an embodiment of the present disclosure. In FIG. 6, the impedance characteristics according to the embodiment is illustrated. In the upper and lower parts of FIG. 6, the impedance characteristics of the transducer 101 and the comparative example illustrated in FIG. 5 are illustrated for comparison.

As illustrated in the middle of FIG. 6, the impedance characteristic of the transducer 101 connected to the matching circuit 102 has two resonance points P21 and P22, and one anti-resonance point P23. The resonance frequency at a resonance point P22 may be higher than the anti-resonance frequency at the anti-resonance point P02 of the transducer 101. The resonance frequency at a resonance point P21 may be lower than the resonance frequency at the resonance point P01 of the transducer 101. Therefore, the resonance point P01 (resonance frequency) and the anti-resonance point P02 (anti-resonance frequency) of the transducer 101 illustrated in the upper part are located between the resonance points P21 and P22 (resonance frequencies).

In the embodiment, the values of the inductor LL and the capacitive component CL of the matching circuit 102 are adjusted so that the two resonance points P21 and P22 satisfy the above conditions with respect to the resonance point P01 and the anti-resonance point P02 of the transducer 101. The resonance frequencies and the anti-resonance frequency of the transducer 101 connected to the matching circuit 102 may be calculated from the following equations.

Resonance frequencies:

$$\omega^2 \left( L_1 \pm \sqrt{\frac{c_0 + c_L}{c_1}} \cdot L_L \right) C_1 = 1 \quad (1)$$

Anti-resonance frequency:

$$\omega^2 L_1 \frac{(c_0 + c_L)c_1}{c_0 + c_L + c_1} = 1 \quad (2)$$

In the equations (1) and (2), $L_L$ and $C_L$ are the values of the inductor LL and the capacitive component CL in the matching circuit 102 illustrated in FIG. 3, respectively, and $L_1$, $C_0$ and $C_1$ are the values of the inductor L1 and the capacitors C0 and C1 in the equivalent circuit illustrated in FIG. 4(a), respectively. The resonance frequencies and the anti-resonance frequency are calculated as the value of f when expression $\omega = 2\pi f$ is substituted into the above expressions (1) and (2).

It is to be noted that instead of using equations (1) and (2) above to calculate the values of the inductor LL and the capacitive component CL, the following calculation can also be performed. In equation (2), by setting $C_L$ to a value, the anti-resonance frequency $\omega$ of equation (2) can be calculated. Once $\omega$ is calculated, $\omega$, the values $R_1$, $L_1$, $C_1$ and $C_0$ in the equivalent circuit, and the value $C_L$ of the capacitor CL can be substituted into the following equation to calculate the value $L_L$ of the inductor LL.

$$\frac{\left((\omega L_1 - 1/\omega C_1)(1 - \omega(C_0 + C_L)(\omega L_1 - 1/\omega C_1)) - \omega R_1^2(C_0 + C_L)\right)}{\left((1 - \omega(C_0 + C_L)(\omega L_1 - 1/\omega C_1))^2 + \omega^2 R_1^2(C_0 + C_L)^2\right)} + \omega L_L = 0 \quad (3)$$

In an example embodiment, the value of the capacitive component CL is set to approximately twice the value of the capacitor C0 of FIG. 4(a). The value of the inductor LL is calculated from the above equations (1) and (2) so that the two resonance points P21 and P22 (resonance frequencies) and the anti-resonance point P23 (anti-resonance frequency) satisfy the relationship illustrated in FIG. 6.

In one embodiment, the values $L_L$ and $C_L$ of the inductor LL and the capacitive component CL in the matching circuit 102 may be adjusted so that the impedance of the transducer 101 connected to the matching circuit 102 becomes substantially the same value at the two resonance points P21 and P22. Thus, a fluctuation range of impedance between the resonance points P21 and P22 and the anti-resonance point P23 can be suppressed, and as described later, a frequency band at which the transmission power of the transducer 101 is stable can be widened.

As illustrated in FIG. 6, in the configuration of the embodiment, when the matching circuit 102 is connected to the transducer 101, the resonance point P01 of the transducer 101 before the connection shifts to the resonance point P21 on the low-frequency side after the connection, and in the vicinity of the frequency that was the resonance point P01 in the transducer 101 before the connection, not a resonance point but the anti-resonance point P23 appears. Further, an anti-resonance point may be unsuitable for transmitting high power because of its high impedance characteristic. However, since this anti-resonance point P23 is generated by the influence of the resonance points P21 and P22 generated by interference between the electrical resonance point originally possessed by the transducer 101 and the matching circuit 102, the impedance of the anti-resonance point P23 becomes lower than the impedance of the transducer 101 itself. It is to be noted that when calculating the values $C_L$ and $L_L$ of the capacitive component CL and the inductor LL by solving the equations (1) and (2), or (2) and (3) above, the impedance at the resonance points P21, P22 is the same. However, having the same impedance at P21, P22 may not be a critical issue. If that is not an issue, it is possible to allow the values $C_L$ and $L_L$ to deviate from the calculated values. For example, the inventor has realized that even if the values $C_L$ and $L_L$ deviate +/−20% from the calculated values, the impedance characteristic of the transducer 101 connected to the matching circuit 102 (middle graph of FIG. 6) still has the two resonance points P21, P22 and the anti-resonance point P23, but the impedance at P21 and P22 are different. Therefore, the values $C_L$ and $L_L$ of the capacitive component CL and the inductor LL of the present disclosure do not have to strictly respect above equations (1), (2) and (3). Furthermore, the skilled person will appreciate that the values $C_L$ and $L_L$ of the capacitive component CL and the inductor LL could be obtained in other ways, such as empirically or through trial and error.

In one embodiment, comparing the graphs in the middle and lower parts of FIG. 6, compared to the matching circuit of the comparative example which is designed to have one resonance point, with the matching circuit 102 of the embodiment, the minimum impedance is higher. However, in the configuration of the embodiment, since the impedance characteristic of the transducer 101 connected to the matching circuit 102 has two resonance points P21 and P22 (resonance frequencies), a bandwidth in which the transmission power of the transducer 101 is stable can be expanded compared with the case where there is only one resonance point P11 (resonance frequency) as in the comparative example, and a stable transmission of ultrasonic waves in a wide band is possible. This will be described below.

Figure 7:
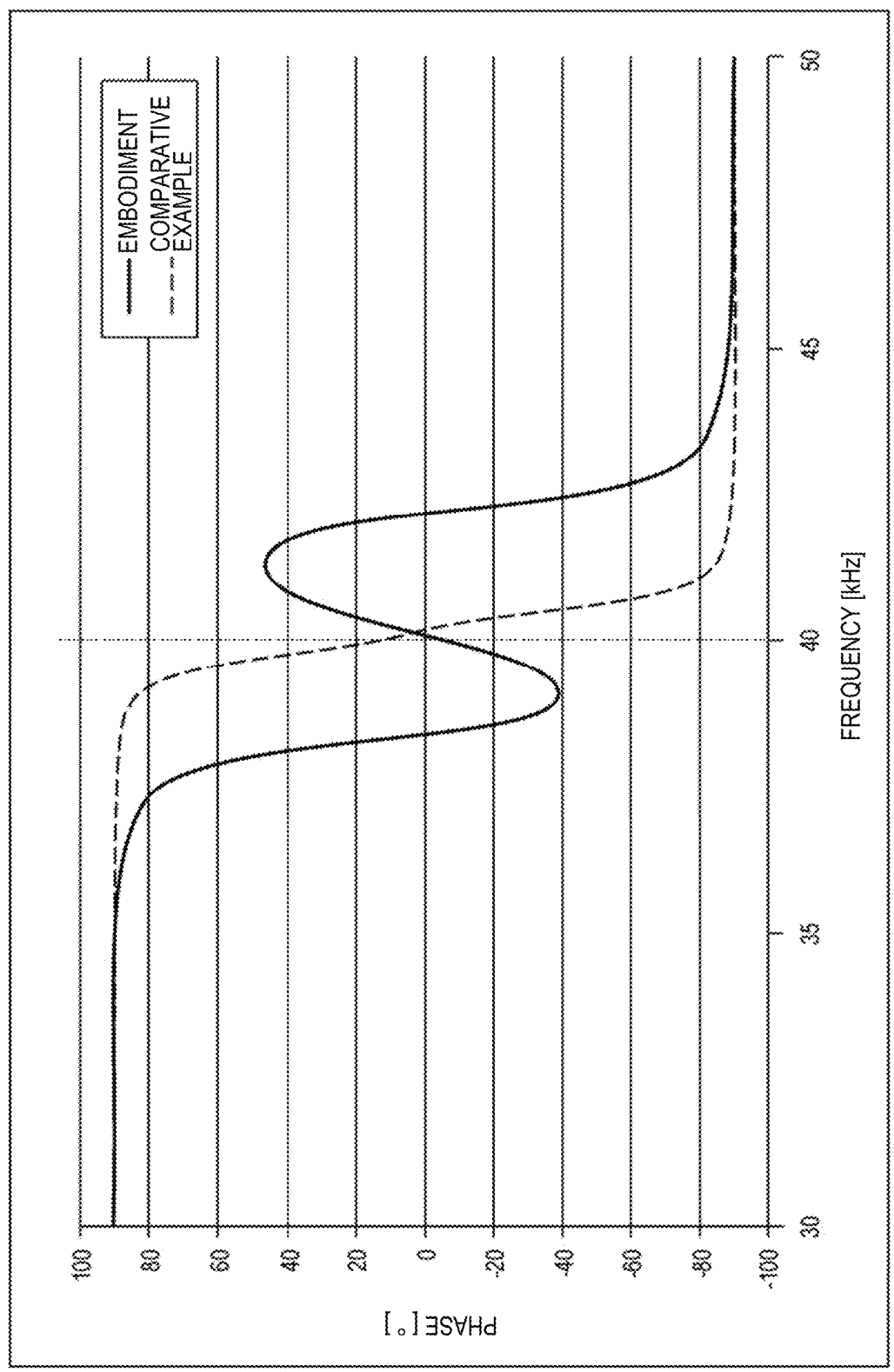
FIG. 7 is a graph illustrating phase characteristics of the transducer connected to the matching circuit according to the comparative example, and according to an embodiment of the present disclosure.

FIG. 7 is a graph illustrating the phase characteristics of the transducer 101 connected to the matching circuit 102 according to the embodiment and according to the comparative example. As illustrated in FIG. 7, in the configuration of the comparative example, the phase of the transducer 101 connected to the matching circuit 102 rapidly inverts to a negative value in the vicinity of the resonance frequency (here, 40 kHz) of the resonance point P11.

In one embodiment, in the configuration of the embodiment, the phase of the transducer 101 connected to the matching circuit 102 may have a small positive and negative amplitude around the anti-resonance frequency (in this case, a frequency slightly higher than 40 kHz) of the anti-resonance point P23 and may then converge to a negative value. The frequencies of the positive and negative peak positions in this amplitude correspond to the resonance frequencies of the resonance points P21 and P22 in FIG. 6.

Assuming that the phase of the transducer 101 connected to the matching circuit 102 is 0, the transmission power of the transducer 101 may be calculated by the following equation:

$$\text{Transmission power}=(V^2/Z)\times\cos\theta \qquad (4),$$

wherein V is a value of the voltage supplied from the terminal T1 of FIG. 3 to the matching circuit 102, and Z is the impedance of the transducer 101 connected to the matching circuit 102.

Figure 8:
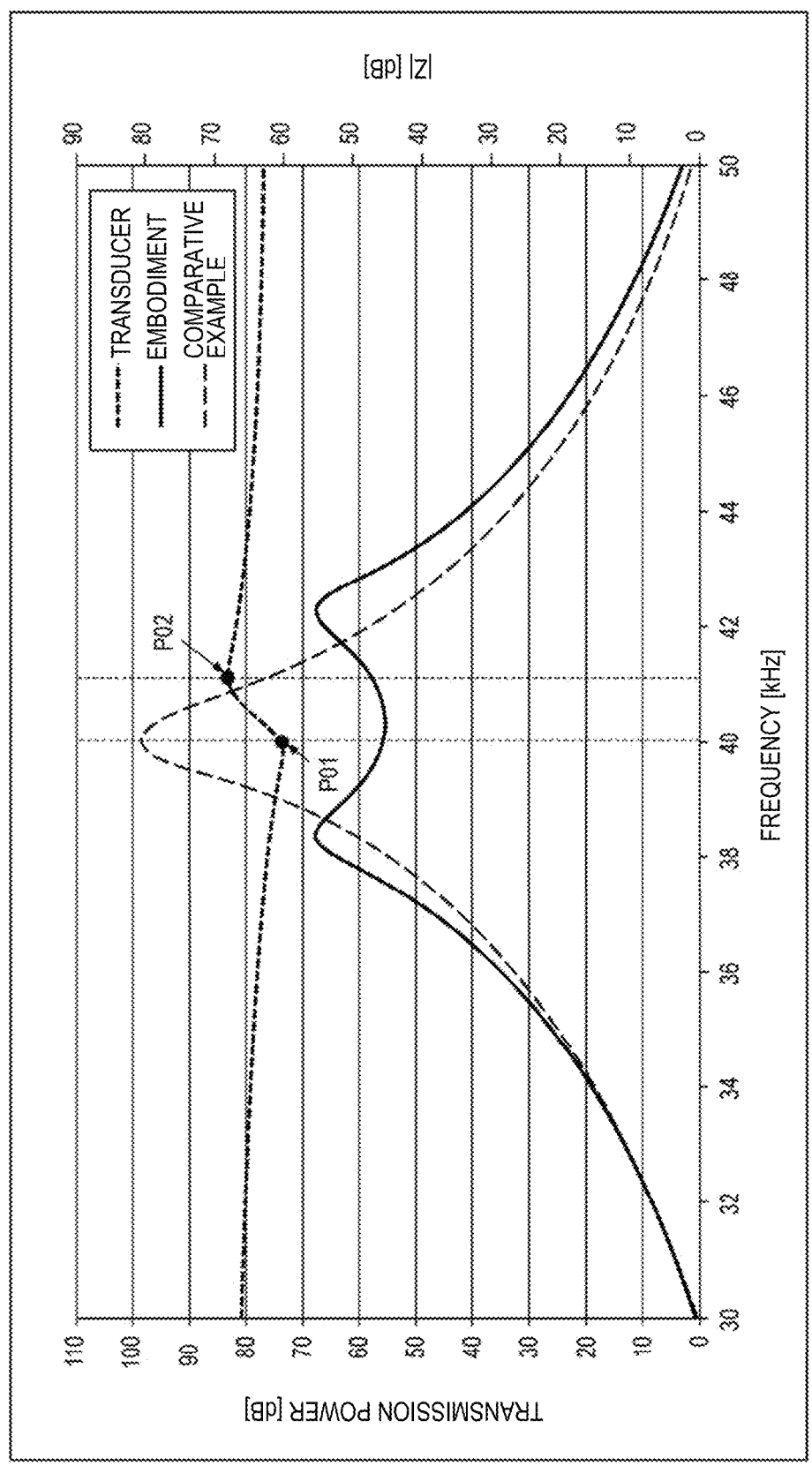
FIG. 8 is a graph illustrating transmission power of the transducer in the configuration of an embodiment of the present disclosure and the comparative example.
Figure 9:
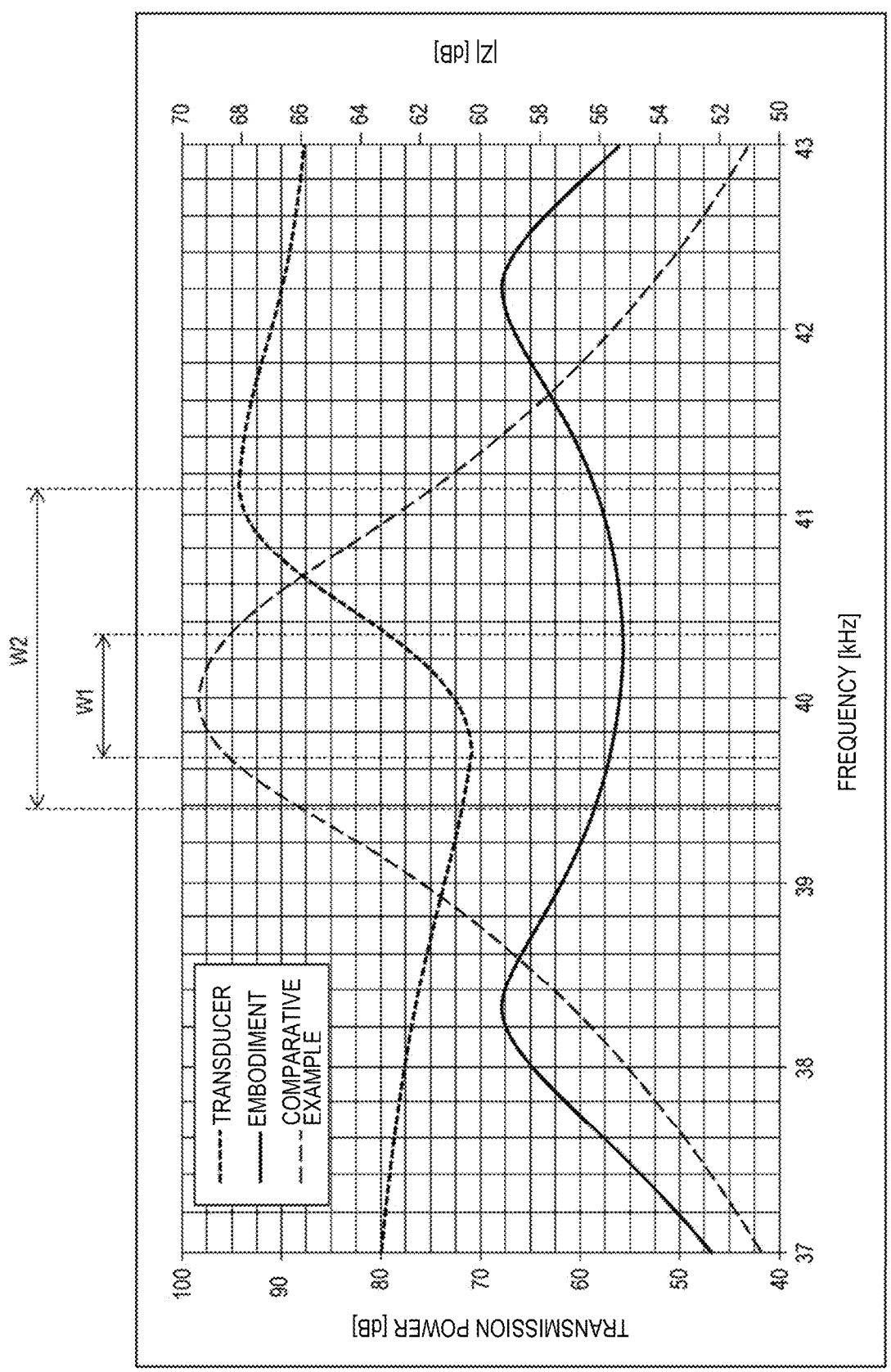
FIG. 9 is an enlarged view of a frequency band near the centre of FIG. 8.

FIG. 8 is a graph illustrating the transmission power of the transducer 101 in the configuration of the embodiment and the comparative example. FIG. 9 is an enlarged view of a frequency band near the centre of FIG. 8. FIGS. 8 and 9 illustrate graphs illustrating the transmission power of the transducer 101 in the configuration of the embodiment and the comparative example, and a graph (dotted line) illustrating the impedance characteristic of the transducer 101 as in FIGS. 5 and 6.

As illustrated in FIG. 8, in the comparative example, the transmission power of the transducer 101 rapidly increases in the vicinity of the resonance point P01 (resonance frequency) of the transducer 101. In one embodiment, the change of the transmission power near the resonance point P01 may be gradual as compared with the comparative example. This is because, as illustrated in FIG. 7, the phase change in the embodiment is smaller than that in the comparative example, and therefore the transmission power is more controlled with the phase parameter θ of equation (4), compared with the comparative example.

Referring to FIG. 9, it can be seen that in the embodiment, the change of the transmission power when moving away from a centre frequency may be significantly suppressed compared to the comparative example. For example, using the definition of a general band-pass filter, when a bandwidth of the frequency in which the transmission power varies by 3 dB from the value of the centre frequency is compared, in the configuration of the comparative example, a 39.7-40.3 kHz band W1 is in the variation range of 3 dB, while in the configuration of the embodiment, a 39.4-41.2 kHz band W2 is in the variation range of 3 dB. Therefore, in the configuration of the embodiment, the band that can be stably transmitted can be remarkably expanded as compared with the configuration of the comparative example. Thus, in the configuration of the embodiment, ultrasonic waves can be transmitted more stably.

As illustrated in FIG. 6, the impedance characteristic of the transducer 101 connected to the matching circuit 102 has the resonance point P21 (first resonance frequency) and the resonance point P22 (second resonance frequency) higher than the resonance point P21 (first resonance frequency). As a result, as illustrated in FIG. 9, the transmission power of the transducer 101 can be stabilized in the vicinity of the band W2 across the resonance point P21 (first resonance frequency) and the resonance point P22 (second resonance frequency). Thus, the band in which the transmission power of the transducer 101 can be stabilized can be effectively expanded.

Further, as illustrated in FIG. 6, the resonance point P22 (second resonance frequency) of the transducer 101 connected to the matching circuit 102 may be higher than the anti-resonance point P02 (anti-resonance frequency) of the transducer 101. Thus, as illustrated in FIG. 9, the band in which the transmission power of the transducer 101 is stabilized can be expanded to the high-frequency side. It can be noted that, the resonance point P21 (first resonance frequency) of the transducer 101 connected to the matching circuit 102 may be lower than the resonance point P01 (resonance frequency) of the transducer 101. Thus, as illustrated in FIG. 9, the band in which the transmission power of the transducer 101 is stabilized can be expanded to the low-frequency side.

In one embodiment, as illustrated in FIG. 6, the resonance point P01 (resonance frequency) and the anti-resonance point P02 (anti-resonance frequency) of the transducer 101 may be located between the resonance point P21 (first resonance frequency) and the resonance point P22 (second resonance frequency) of the transducer 101 connected to the matching circuit 102. In other words, the resonance point P21 (first resonance frequency) and the resonance point P22 (second resonance frequency) may be located outside the resonance point P01 (resonance frequency) and the anti-resonance point P02 (anti-resonance frequency) of the transducer 101, respectively. Further, as illustrated in FIG. 9, the band in which the transmission power of the transducer 101 is stabilized can be expanded to both the low-frequency side and the high-frequency side.

In another embodiment, as illustrated in FIG. 6, the impedance characteristic of the transducer 101 connected to the matching circuit 102 may further have the anti-resonance point P23 (first anti-resonance frequency) between the resonance point P21 (first resonance frequency) and the resonance point P22 (second resonance frequency), and the anti-resonance point P23 (first anti-resonance frequency) of the transducer 101 connected to the matching circuit 102 may be lower than the anti-resonance point P02 (anti-resonance frequency) of the transducer 101.

In yet another embodiment, as illustrated in FIG. 6, the impedance of the transducer 101 connected to the matching circuit 102 at the anti-resonance point P23 (first anti-resonance frequency) may be lower than an impedance of the transducer 101 in a range between the resonance points P21 and P22 (first and second resonance frequencies). Further, the impedance of the transducer 101 connected to the matching circuit 102 can be made lower than the impedance of the transducer 101 itself in the vicinity of the band W2 across the resonance point P21 (first resonance frequency) and the resonance point P22 (second resonance frequency), and the transmission power of the transducer can be enhanced.

In yet another embodiment, as illustrated in FIG. 6, the impedance characteristic of the transducer 101 may have exactly one resonance point P01 (resonance frequency) and exactly one anti-resonance point P02 (anti-resonance frequency), and the impedance characteristic of the transducer 101 connected to the matching circuit 102 may have exactly two resonance points P21 and P22 (resonance frequencies). Further, the impedance of the transducer 101 connected to the matching circuit 102 can be lowered from the impedance of the transducer 101 itself in the vicinity of the band across the two resonance points P21 and P22 (resonance frequencies), and the transmission power of the transducer can be enhanced.

Further, as discussed above and illustrated in FIG. 3, the matching circuit 102 may include the capacitive component CL and the inductor LL, the capacitive component CL may be connected in parallel with the transducer 101, and the inductor LL may be connected in series with the parallel connection. A capacitance of the capacitive component and an inductance of the inductor may be selected such that the impedance characteristic of the transducer connected to the matching circuit has the first resonance frequency and the second resonance frequency.

In one embodiment, the capacitance of the capacitive component and the inductance of the inductor may be selected based on the above equation (1) with a margin of +/−20% in the values of the capacitance of the capacitive component and the inductance of the inductor.

In one embodiment, the impedance characteristic of the transducer 101 connected to the matching circuit 102 may be adjusted to further have the anti-resonance point P23 (first anti-resonance frequency) between the resonance point P21 (first resonance frequency) and the resonance point P22 (second resonance frequency), as illustrated in FIG. 6. Here, the anti-resonance frequency (first anti-resonance frequency) at the anti-resonance point P23 may be determined by the above equation (2) based at least in part on the capacitance $C_L$ of the capacitive component CL.

Further, the capacitance of the capacitive component and the inductance of the inductor may be selected based on the above equation (2) with a margin of +/−20% in values of the capacitance of the capacitive component and the inductance of the inductor.

Further, the resonance frequency (first resonance frequency) at the resonance point P21 and the resonance frequency (second resonance frequency) at the resonance point P22 of the transducer 101 connected to the matching circuit 102 may be determined by the above equation (1) based at least in part on the capacitance $C_L$ of the capacitive component CL or the inductance $L_L$ of the inductor LL.

Therefore, by adjusting the values of the inductor LL and the capacitive component CL constituting the matching circuit 102, the first resonance frequency and the second resonance frequency can be set to desired values, and the band in which the transmission power of the transducer is stabilized can be set to the desired band.

It can be noted that as illustrated in FIG. 3, the matching circuit 102 may not include a transformer. Thus, the amplifier circuit 100 can be miniaturized. Further, the transducer may be arranged to transmit an ultrasonic wave. Further, as illustrated in FIG. 2, the sonar 10 may include the amplifier circuit 100 of FIG. 3. Therefore, the amplifier circuit 100 can form a stable band with a small impedance change while reducing the impedance of the transducer 101 connected to the matching circuit 102 as described above. Thus, the ultrasonic wave can be transmitted from the transducer 101 more stably in a wide band.

In the above embodiment, as illustrated in FIG. 6, the impedance characteristic of the transducer 101 has one resonance frequency (resonance point P01) and one anti-resonance frequency (anti-resonance point P02). On the other hand, in another embodiment, the transducer 101 is fixed to a matching layer, and the impedance characteristic of the transducer 101 fixed to the matching layer has a plurality of anti-resonance frequencies. That is, in another embodiment, a so-called transducer with a matching layer is used.

Figure 10:
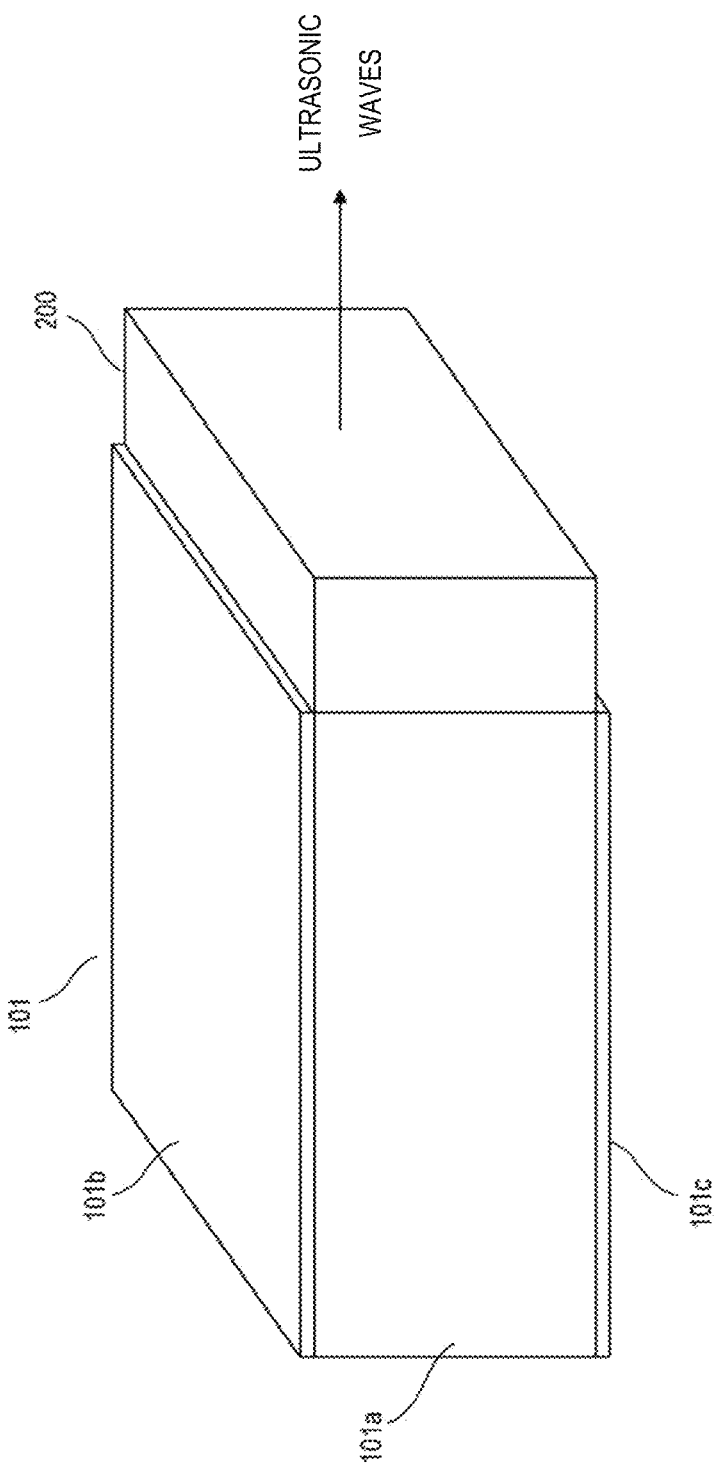
FIG. 10 is a diagram illustrating an example of a configuration of the transducer with a matching layer, according to another embodiment of the present disclosure.

FIG. 10 is a diagram illustrating an example of a configuration of the transducer 101 with the matching layer. The transducer 101 may include a piezoelectric element 101a, an upper electrode 101b, and a lower electrode 101c. The piezoelectric element 101a may have a cuboid shape. The shape of the piezoelectric element 101a may not be limited to the cuboid, but may be any other shape such as a cube. A matching layer 200 may be fixed to one side surface of the piezoelectric element 101a by an adhesive or the like. A voltage inverting positive and negative at a given frequency may be applied to the upper electrode 101b via the terminal T1 of the transmission amplifier 103 illustrated in FIG. 3, and the lower electrode 101c may be connected to the ground. Thus, ultrasonic waves are outputted from a side surface of the matching layer 200.

Further, the configuration of the transducer 101 with the matching layer may not be limited to the configuration of FIG. 10, but may be another configuration. The transducer 101 in one embodiment has the configuration in which the matching layer 200 is removed from the configuration in FIG. 10.

Figure 11B:
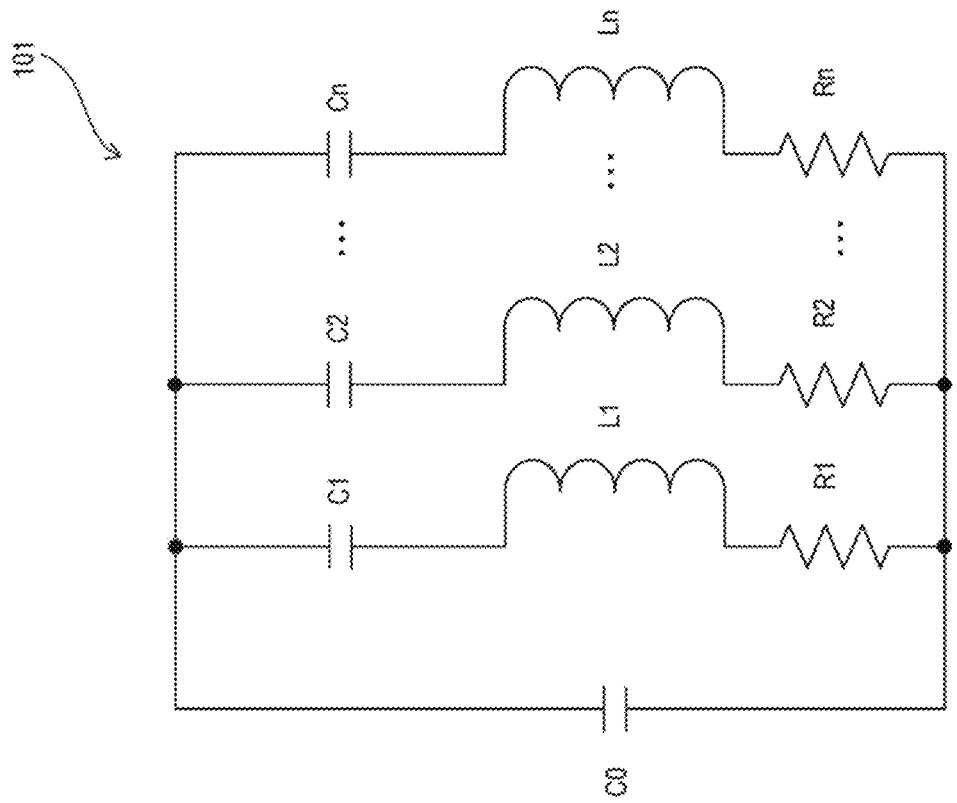
FIG. 11(*a*) is a diagram illustrating the equivalent circuit of the transducer with the matching layer, according to the another embodiment of the present disclosure.
Figure 11A:
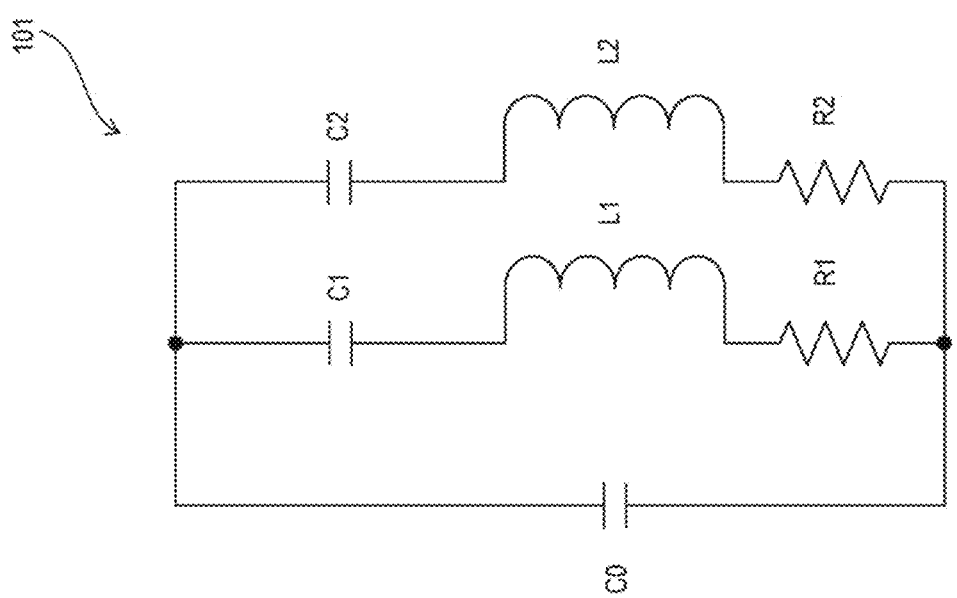

FIG. 11(a) is a diagram illustrating an equivalent circuit of the transducer 101 with the matching layer illustrated in FIG. 10. In the equivalent circuit of FIG. 11(a), as compared with FIG. 4(a), a capacitor C2, an inductor L2, and a resistor R2 corresponding to the matching layer 200 are further connected in parallel to the capacitor C0. When the matching layer 200 comprising a plurality of layers is fixed to the transducer 101, the equivalent circuit has the configuration illustrated in FIG. 11(b).

Figure 12:
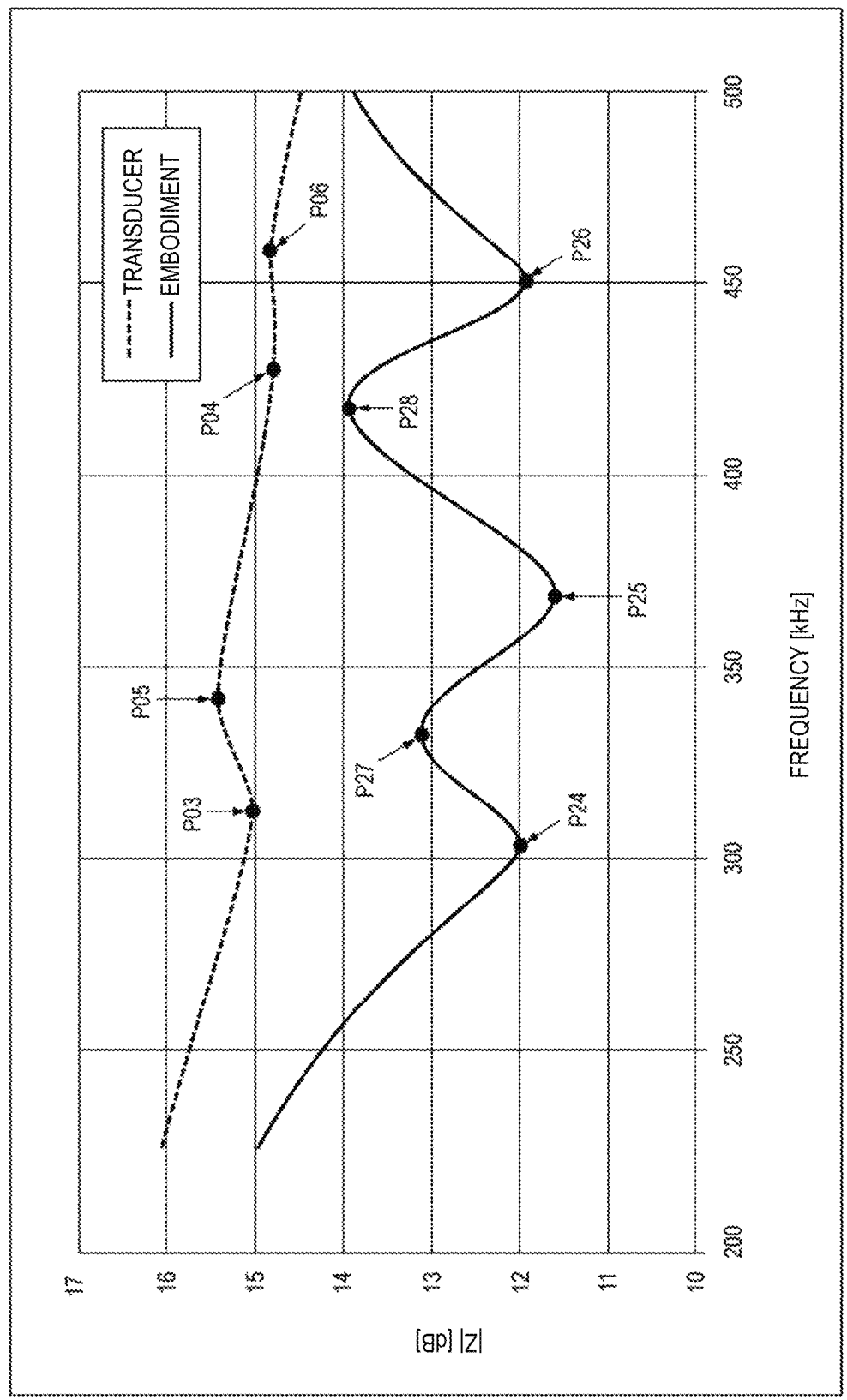
FIG. 12 is the graph illustrating impedance characteristics, according to the another embodiment of the present disclosure.

FIG. 12 is a graph illustrating impedance characteristics according to another embodiment. In FIG. 12, an assumed size of the transducer 101 is different from that in FIG. 6, and therefore frequency range of the horizontal axis is different from that in FIG. 6. The impedance characteristic illustrated in FIG. 12 is an example and may vary depending on the size of the transducer 101, the structure of the matching layer 200, and the like.

The upper part of FIG. 12 may illustrate the impedance characteristic of the transducer 101 fixed to the matching layer 200. As described above, in another embodiment, since the transducer 101 is fixed to the matching layer 200, from the equivalent circuit illustrated in FIG. 11(a), the impedance characteristic of the transducer 101 fixed to the matching layer 200 has two resonance points P03 and P04 and two anti-resonance points P05 and P06. When the matching layer 200 to which the transducer 101 is fixed includes a plurality of layers, from the equivalent circuit of FIG. 11(b), the impedance characteristic of the transducer 101 fixed to the matching layer 200 may have more resonance points and more anti-resonance points.

The lower part of FIG. 12 may illustrate the impedance characteristic of the transducer 101 fixed to the matching layer 200 and connected to the matching circuit 102. Further, as illustrated in the lower part of FIG. 12, the impedance characteristic of the transducer 101 fixed to the matching layer 200 and connected to the matching circuit 102 has 3 resonance points P24, P25, P26 and 2 anti-resonance points P27, P28. Further, as illustrated in FIG. 12, the resonance frequency at the resonance point P26 is higher than an average of the anti-resonance frequencies at the two anti-resonance points P05 and P06 of the transducer 101 fixed to the matching layer 200.

As illustrated in the upper part of FIG. 12, when the impedance characteristic of the transducer 101 fixed to the matching layer 200 has two resonance points P03 and P04, the impedance of the transducer 101 fixed to the matching layer 200 and connected to the matching circuit 102 is expressed by the following equation.

$$|Z| = f(\omega) = j\omega L_L + \left( \frac{1}{j\omega(C_L + C_0)} + \frac{1}{\left(j\omega L_1 + \frac{1}{j\omega C_1} + R_1\right)} + \frac{1}{\left(j\omega L_2 + \frac{1}{j\omega C_2} + R_2\right)} \right)^{-1} \quad (5)$$

In equation (5), $L_L$ and $C_L$ are respectively the values of the inductor LL and the capacitive component CL in the matching circuit 102 illustrated in FIG. 3, and $L_1$, $L_2$, $C_0$, $C_1$, $C_2$, $R_1$, and $R_2$ are respectively the values of the inductors L1, L2, capacitors C0, C1, C2 and resistors R1, R2 in the equivalent circuit illustrated in FIG. 11(a). Further, at the resonance points and the anti-resonance points, the value obtained by differentiating the above equation (5) becomes 0, and the following relationship is satisfied.

$$\frac{d}{d\omega} f(\omega) = 0 \quad (6)$$

Assuming that solutions satisfying the above equation (6) are oil, ω2, ω3, ω4, and ω5 (ω1<ω2<ω3<ω4<ω5), ω1, ω3, and ω5 are resonance points, and ω2 and ω4 are anti-resonance points. Here, assuming that an impedance variation width in a target band across the three resonance points is ΔZ (for example, 3 decibels), by setting the values of the inductor LL and the capacitive component CL of the matching circuit 102 based on the values of inductors L1, L2, capacitors C0, C1, C2, and resistors R1, R2 in the equivalent circuit illustrated in FIG. 11(a) so that the following three equations are satisfied, maximum bandwidth having the impedance variation width ΔZ can be realized.

$$f(\omega 2) \approx f(\omega 4) \quad (7)$$

$$f(\omega 1) \approx f(\omega 3) \approx f(\omega 5) \quad (8)$$

$$f(\omega 2) \approx f(\omega 1) \times 10^{(\Delta Z/20)} \quad (9)$$

Further, by applying the expression ω=2πf to the values ω1, ω2, ω3, ω4, and ω5 thus obtained, the frequencies of the resonance points and the anti-resonance points are respectively calculated.

The graph at the bottom of FIG. 12 illustrates an example. In this example, the impedance values at the resonance points P24, P25, and P26 do not exactly coincide with each other due to effect such as the size of the transducer 101, but are substantially the same, thus satisfying the equation (8) above. Similarly, the impedance values at the anti-resonance points P27 and P28 do not exactly coincide with each other, but are substantially the same, thus satisfying the equation (7) above. Thus, the bandwidth in which the impedance variation width ΔZ becomes 3 dB can be expanded to about 250 kHz (in FIG. 12, approximately 250-500 kHz). Therefore, based on the equation (4), the bandwidth in which the transmission power of the transducer 101 is stabilized can be expanded to about 250 kHz. Therefore, the ultrasonic wave can be stably transmitted over a wider band while lowering the impedance at the time of transmission.

In one embodiment, when the equivalent circuit of the transducer 101 fixed to the matching layer 200 is represented in FIG. 11(b) by increasing the number of layers of the matching layer 200, the resonance points and the anti-resonance points may be adjusted by the same method. In this case, the equation (5) above is modified to the following equation.

$$|Z| = f(\omega) = j\omega L_L + \left( \frac{1}{j\omega(C_L + C_0)} + \Sigma_1^n \frac{1}{\left(j\omega L_x + \frac{1}{j\omega C_x} + R_x\right)} \right)^{-1} \quad (10)$$

In this case as well, ω is acquired as resonance point or anti-resonance point when a differential of equation (10) is 0.

Further, the values of the inductor LL and the capacitive component CL of the matching circuit 102 are set so as to satisfy the conditions that the impedance values at the plurality of acquired resonance points are substantially the same, the impedance values at the plurality of acquired anti-resonance points are substantially the same, and a relationship between the resonance points and the anti-resonance points satisfies the equation (9) above. Thus, the maximum bandwidth having the impedance variation width ΔZ (for example, 3 dB) can be realized.

As illustrated in FIG. 10, the transducer 101 may be fixed to the matching layer 200, and the impedance characteristic of the transducer 101 fixed to the matching layer 200 may have a plurality of anti-resonance points P05 and P06 (anti-resonance frequencies), as illustrated in FIG. 12. The frequency (second resonance frequency) of the resonance point P26 of the transducer 101 fixed to the matching layer 200 and connected to the matching circuit 102 may be adjusted higher than an average of the frequencies (anti-resonance frequencies) of the plurality of anti-resonance points P05 and P06 of the transducer 101 fixed to the matching layer 200. Further, the impedance of the transducer 101 fixed to the matching layer 200 and connected to the matching circuit 102 can be stabilized in a vicinity of a band across the resonance point P24 (first resonance frequency) and the resonance point P26 (second resonance frequency), and the transmission power of the transducer 101 can be stabilized in the vicinity of this band. Therefore, the band for stabilizing the transmission power of the transducer can be effectively expanded, and the ultrasonic wave can be transmitted stably in a wider band.

In the above embodiments, as illustrated in FIG. 6, the values $C_L$ and $L_L$ of the capacitive component CL and the inductor LL of the matching circuit 102 are adjusted so that the impedances at the two resonance points P21 and P22 substantially coincide with each other. As a result, as illustrated in FIG. 9, a characteristic of the transmission power is substantially flattened in the band W2, and variation of the transmission power when moving away from the centre frequency is substantially suppressed.

Further, the matching circuit 102 may be designed to change the transmission power for each frequency by inclining a characteristic of the transmission power in a given band. In this case, according to this inclination, the values $C_L$ and $L_L$ of the capacitive component CL and the inductor LL of the matching circuit 102 may be adjusted so that the impedance at the resonance points P21 and P22 are different from each other.

Similarly, in another embodiment, the matching circuit 102 may be designed to incline the transmission power characteristic in a given band. In this case, it is sufficient to add aω (a is a coefficient corresponding to the desired inclination of the transmission power characteristic) to the right side of the f(ω) equation in the equations (5) or (10) above to perform a design based on the same conditions as in the equations (6) to (9).

Further, in each of the above embodiments, the spread angle of the reception spaces RS1 in the depression angle φ direction is 90 degrees, but the present disclosure is not limited thereto. For example, the spread of the reception spaces RS1 in the depression angle φ direction may be made smaller than 90 degrees. For example, a two-dimensional sonar using an umbrella-shaped transmission beam may be used.

Further, it is not necessary for the sonar 10 to be a full-circle sonar (i.e., 360 deg.) that detects a target over the entire circumference in the azimuth angle θ direction. For example, the sonar may be a half-circle sonar (i.e., 180 deg.) or a forward-looking sonar. In addition, the embodiments of the present disclosure may be modified appropriately within the scope of the claims.

Terminology

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

All of the processes described herein may be embodied in, and fully automated via, software code modules executed by a computing system that includes one or more computers or processors. The code modules may be stored in any type of non-transitory computer-readable medium or other computer storage device. Some or all the methods may be embodied in specialized computer hardware.

Many other variations than those described herein will be apparent from this disclosure. For example, depending on the embodiment, certain acts, events, or functions of any of the algorithms described herein can be performed in a different sequence, can be added, merged, or left out altogether (e.g., not all described acts or events are necessary for the practice of the algorithms) Moreover, in certain embodiments, acts or events can be performed concurrently, e.g., through multi-threaded processing, interrupt processing, or multiple processors or processor cores or on other parallel architectures, rather than sequentially. In addition, different tasks or processes can be performed by different machines and/or computing systems that can function together.

The various illustrative logical blocks and modules described in connection with the embodiments disclosed herein can be implemented or performed by a machine, such as a processor. A processor can be a microprocessor, but in the alternative, the processor can be a controller, microcontroller, or state machine, combinations of the same, or the like. A processor can include electrical circuitry configured to process computer-executable instructions. In another embodiment, a processor includes an application specific integrated circuit (ASIC), a field programmable gate array (FPGA) or other programmable device that performs logic operations without processing computer-executable instructions. A processor can also be implemented as a combination of computing devices, e.g., a combination of a digital signal processor (DSP) and a microprocessor, a plurality of microprocessors, one or more microprocessors in conjunction with a DSP core, or any other such configuration. Although described herein primarily with respect to digital technology, a processor may also include primarily analog components. For example, some or all of the signal processing algorithms described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Any process descriptions, elements or blocks in the flow diagrams described herein and/or depicted in the attached figures should be understood as potentially representing modules, segments, or portions of code which include one or more executable instructions for implementing specific logical functions or elements in the process. Alternate implementations are included within the scope of the embodiments described herein in which elements or functions may be deleted, executed out of order from that shown, or discussed, including substantially concurrently or in reverse order, depending on the functionality involved as would be understood by those skilled in the art.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C. The same holds true for the use of definite articles used to introduce embodiment recitations. In addition, even if a specific number of an introduced embodiment recitation is explicitly recited, those skilled in the art will recognize that such recitation should typically be interpreted to mean at least the recited number (e.g., the bare recitation of "two recitations," without other modifiers, typically means at least two recitations, or two or more recitations).

It will be understood by those within the art that, in general, terms used herein, are generally intended as "open" terms (e.g., the term "including" should be interpreted as "including but not limited to," the term "having" should be interpreted as "having at least," the term "includes" should be interpreted as "includes but is not limited to," etc.).

For expository purposes, the term "horizontal" as used herein is defined as a plane parallel to the plane or surface of the floor of the area in which the system being described is used or the method being described is performed, regardless of its orientation. The term "floor" can be interchanged with the term "ground" or "water surface." The term "vertical" refers to a direction perpendicular to the horizontal as just defined. Terms such as "above," "below," "bottom," "top," "side," "higher," "lower," "upper," "over," and "under," are defined with respect to the horizontal plane.

As used herein, the terms "attached," "connected," "mated" and other such relational terms should be construed, unless otherwise noted, to include removable, moveable, fixed, adjustable, and/or releasable connections or attachments. The connections/attachments can include direct connections and/or connections having intermediate structure between the two components discussed.

Numbers preceded by a term such as "approximately," "about," and "substantially" as used herein include the recited numbers, and also represent an amount close to the stated amount that still performs a desired function or achieves a desired result. For example, the terms "approximately," "about," and "substantially" may refer to an amount that is within less than 10% of the stated amount. Features of embodiments disclosed herein preceded by a term such as "approximately," "about," and "substantially" as used herein represent the feature with some variability that still performs a desired function or achieves a desired result for that feature.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. An amplifier circuit to be used in a sonar, the amplifier circuit comprising:
    a transmission amplifier;
    a transducer; and
    a matching circuit arranged to connect the transmission amplifier to the transducer so as to form a series circuit,
    wherein the transducer has a first impedance characteristic comprising a resonance frequency and an anti-resonance frequency higher than the resonance frequency, and
    wherein the transducer connected to the matching circuit has a second impedance characteristic different from the first impedance characteristic, the second impedance characteristic comprising a first resonance frequency and a second resonance frequency higher than the first resonance frequency.

2. The amplifier circuit of claim 1, wherein the second resonance frequency is higher than the anti-resonance frequency.

3. The amplifier circuit of claim 1, wherein the first resonance frequency is lower than the resonance frequency.

4. The amplifier circuit of claim 1, wherein the resonance frequency and the anti-resonance frequency are between the first resonance frequency and the second resonance frequency.

5. The amplifier circuit of claim 1, wherein, based on the transducer being connected to the matching circuit:
    the second impedance characteristic of the transducer further comprises a first anti-resonance frequency between the first resonance frequency and the second resonance frequency, and
    the first anti-resonance frequency is lower than the anti-resonance frequency.

6. The amplifier circuit of claim 5, wherein an impedance of the second impedance characteristic, at the first anti-resonance frequency, is lower than an impedance of the first impedance characteristic, in a range between the first resonance frequency and the second resonance frequency of the second impedance characteristic.

7. The amplifier circuit of claim 1, wherein the first impedance characteristic consists of a single resonance frequency and a single anti-resonance frequency, the single resonance frequency being the resonance frequency, the single anti-resonance frequency being the anti-resonance frequency, and
    the second impedance characteristic of the transducer consists of a first anti-resonance frequency and two resonance frequencies, the two resonance frequencies being the first resonance frequency and the second resonance frequency.

8. The amplifier circuit of claim 1, wherein
    the transducer is fixed to a matching layer,
    the first impedance characteristic comprises a plurality of anti-resonance frequencies, the plurality of anti-resonance frequencies including the anti-resonance frequency, and
    the second resonance frequency of the second impedance characteristic is higher than an average of the plurality of anti-resonance frequencies of the first impedance characteristic.

9. The amplifier circuit of claim 1, wherein
    the matching circuit comprises a capacitive component and an inductor,
    wherein the capacitive component is connected in parallel with the transducer,
    wherein the inductor is connected in series with the parallel connection of the capacitive component and the transducer,
    wherein a capacitance of the capacitive component and an inductance of the inductor are selected such that the second impedance characteristic has the first resonance frequency and the second resonance frequency.

10. The amplifier circuit of claim 9, wherein the capacitance of the capacitive component and the inductance of the inductor are selected based on equation $$\omega^2 \left( L_1 \pm \sqrt{\frac{c_0 + c_L}{c_1}} \cdot L_L \right) C_1 = 1,$$

where LL and CL are values of the inductance of the inductor and the capacitance of the capacitive component in the matching circuit, respectively, L1, C0 and C1 are values of an inductor L1 and capacitors C0 and C1 in an equivalent circuit representing the transducer, and o is one of the first resonance frequency and the second resonance frequency, with a margin of +/−20% in the values of the capacitance of the capacitive component and the inductance of the inductor.

11. The amplifier circuit of claim 9, wherein
the second impedance characteristic comprises a first anti-resonance frequency between the first resonance frequency and the second resonance frequency, and
the first anti-resonance frequency is defined based at least in part on the capacitance of the capacitive component.

12. The amplifier circuit of claim 11, wherein the capacitance of the capacitive component and the inductance of the inductor are selected based on equation $$\omega^2 L_1 \frac{(c_0 + c_L)c_1}{c_0 + c_L + c_1} = 1,$$

where CL is a value of the capacitance of the capacitive component in the matching circuit, L1, C0 and C1 are values of an inductor L1 and capacitors C0 and C1 in an equivalent circuit representing the transducer, and $\omega$ is the first anti-resonance frequency, with a margin of +/−20% in values of the capacitance of the capacitive component and the inductance of the inductor.

13. The amplifier circuit of claim 9, wherein the first resonance frequency and the second resonance frequency are defined based at least in part on the capacitance of the capacitive component or the inductance of the inductor.

14. The amplifier circuit of claim 1, wherein the matching circuit consists of at least one inductor and at least one capacitor.

15. The amplifier circuit of claim 1, wherein the transducer is arranged to transmit an ultrasonic wave.

16. A sonar for transmitting an ultrasonic wave into water, the sonar comprising the amplifier circuit of claim 1, wherein the transducer is arranged to generate the ultrasonic wave.

17. The amplifier circuit of claim 1, wherein the transmission amplifier is arranged to amplify a voltage of a transmission signal, and to supply the amplified voltage of the transmission signal to the transducer via the matching circuit.

18. The amplifier circuit of claim 1, wherein:
the first resonance frequency is a first local minimum in the second impedance characteristic,
the second resonance frequency higher than the first resonance frequency is a second local minimum in the second impedance characteristic, and
the second impedance characteristic further comprises a first anti-resonance frequency between the first resonance frequency and the second resonance frequency, the first anti-resonance frequency being a local maximum in the second impedance characteristic.

* * * * *